US 8,847,603 B2

(12) United States Patent
Gajic

(10) Patent No.: US 8,847,603 B2
(45) Date of Patent: Sep. 30, 2014

(54) DEVICE AND METHOD FOR DETECTING A GROUND FAULT

(71) Applicant: Zoran Gajic, Vasteras (SE)

(72) Inventor: Zoran Gajic, Vasteras (SE)

(73) Assignee: ABB Technology AG (CH)

( * ) Notice: Subject to any disclaimer, the term of this patent is extended or adjusted under 35 U.S.C. 154(b) by 62 days.

(21) Appl. No.: 13/747,188

(22) Filed: Jan. 22, 2013

(65) Prior Publication Data

US 2013/0193979 A1   Aug. 1, 2013

Related U.S. Application Data

(63) Continuation of application No. PCT/EP2010/060412, filed on Jul. 19, 2010.

(51) Int. Cl.
*G01R 31/14* (2006.01)
*G01R 31/02* (2006.01)
*G01R 31/34* (2006.01)
*H02H 3/17* (2006.01)

(52) U.S. Cl.
CPC ............... *G01R 31/025* (2013.01); *H02H 3/17* (2013.01); *G01R 31/34* (2013.01)
USPC ........................................ 324/510

(58) Field of Classification Search
USPC .................. 324/209, 510; 361/42; 702/58
See application file for complete search history.

(56) References Cited

U.S. PATENT DOCUMENTS

| 3,560,850 | A |   | 2/1971 | Hojding |
|---|---|---|---|---|
| 4,149,208 | A | * | 4/1979 | Fiorentzis ........................ 361/42 |
| 4,228,475 | A |   | 10/1980 | Sherwood |
| 4,589,048 | A |   | 5/1986 | Takata |
| 6,421,618 | B1 |   | 7/2002 | Kliman et al. |
| 7,142,403 | B2 |   | 11/2006 | Lindahl et al. |
| 2008/0042683 | A1 |   | 2/2008 | Kasztenny et al. |

FOREIGN PATENT DOCUMENTS

| CN | 1265532 A | 9/2000 |
|---|---|---|
| CN | 101340082 A | 1/2009 |
| DE | 3029851 A1 | 2/1982 |
| DE | 19620141 A1 | 11/1997 |

(Continued)

OTHER PUBLICATIONS

Alcantara, et al., 100% Stator Ground Fault Protection, A Comparison of Two Protection Methods, Dept. of Industrial Electrical Engineering and Automation, Lund University, 2006.*

(Continued)

*Primary Examiner* — Melissa Koval
*Assistant Examiner* — Daniel Miller
(74) *Attorney, Agent, or Firm* — St. Onge Steward Johnston & Reens LLC

(57) ABSTRACT

An arrangement to detect a ground fault in an AC electric circuit including an electric machine having a neutral point connecting to a neutral point and a terminal side, and a unit transformer connected to the terminal side of the machine, wherein the arrangement includes a signal injection unit, a voltage transformer having a primary winding connected to the terminal side of the electric machine and a secondary winding that is open delta-connected, an instrument transformer having a primary winding connected to the neutral point of the electric machine and a secondary winding, and a ground fault detecting unit. The signal injection unit is configured to inject a signal to the secondary winding of the voltage transformer. The instrument transformer is configured to measure the resultant injected signal at its secondary winding The ground fault detecting unit is configured to detect a ground fault based on the measured signal.

12 Claims, 3 Drawing Sheets

(56) References Cited

FOREIGN PATENT DOCUMENTS

| | | |
|---|---|---|
| EP | 0297933 A1 | 1/1989 |
| EP | 1182762 A2 | 2/2002 |
| EP | 1890369 A1 | 2/2008 |
| EP | 1936393 A1 | 6/2008 |
| EP | 1936773 A1 | 6/2008 |
| JP | 2005033877 A | 2/2005 |
| WO | 9912048 A1 | 3/1999 |
| WO | 2010069739 A1 | 6/2010 |

OTHER PUBLICATIONS

NengLing, et al., Research of subharmonic injection schemes for hydrogenerator stator ground protection, Department of Electrical Engineering, Huazhong University of Science and Technology, China, IEEE, 2000.*

IEEE Guide for Generator Ground Protection, IEEE Std C37.101-2006, 2007.*

Wangyi, et al.; "A Novel Optimal Control Method of Grounding Impedance for Distribution System"; IEEE T&D Asia 2009; pp. 1-4.

Locker, et al.; "Advancements in Technology Create Safer & Smarter HRG Systems"; Copyright Material IEEE; Jun. 21, 2009; pp. 102-113.

He, et al.; "Improved Fault-Location System for Railway Distribution System Using Superimposed Signal"; IEEE Transactions on Power Delivery, vol. 25, No. 3, Jul. 2010; pp. 1899-1911.

Xiangjun, et al.; "Improvement of Subharmonic Injection Schemes for Huge Hydro-Generator Stator Ground Fault Protection"; 2002 IEEE; pp. 707-710.

International Preliminary Report on Patentability Application No. Dec. 17, 2012 Completed: Dec. 17, 2012 19 pages.

International Search Report and Written Opinion of the International Searching Authority Application No. PCT/EP2010/060412 Completed: May 12, 2011; Mailing Date: May 23, 2011 14 pages.

Costello; "Lessons Learned Through Commissioning and Analyzing Data From Transformer Differential Installations"; IEEE Transactions on Industry Applications; vol. 44, No. 4; Jul./Aug. 2008; pp. 979-1003.

Gao, et al.; "Novel Identification Method of Stator Phase-to-Ground Fault for Cable-Wound Generators"; IEEE Transactions on energy Conversion, vol. 23, No. 2; Jun. 2008; pp. 349-357.

Preston, et al.; "Report on Design, Testing and Commissioning of 100% Stator Ground Fault Protection at Dominion's Bath County Pumped-Storage Station"; 2009 IEEE; pp. 1-13.

* cited by examiner

DEVICE AND METHOD FOR DETECTING A GROUND FAULT

FIELD OF THE INVENTION

The present invention relates to the field of protection of an electric device such as a generator, a reactor or an electric motor connected in an AC electric line. It relates to an arrangement and a method for detecting a ground fault. It relates in particular to detect a ground fault that may occur close to a neutral point of the electric machine.

BACKGROUND OF THE INVENTION

A ground fault in an electric machine that is connected to an electrical network may pose a considerable danger for proper operation of the electric machine. For example, a stator ground fault is the most common type of fault to which a generator is subjected. It is the most frequent cause of damage to the stator winding of the generator and it can be a direct cause of a consequent phase-to-phase fault. The electric machine is grounded via a grounding system, such as an impedance to limit mechanical stresses and fault damage in the machine, to limit transient voltage during faults, and to provide a means for detecting ground faults within the electric machine. Although, the first ground fault current may be negligible and will not cause immediate damage, two successive ground faults may result in a short-circuit current that cannot be limited by the grounding system, which may consequently result in a serious damage to the electric machine and such a damage can be very costly.

For example, for a three-phase electric generator, a stator ground fault protection is achieved by measuring zero sequence voltage at the neutral point of the generator, which can provide 95% of protection of a stator winding from the terminals of the generator, while 5% of the stator winding close to the neutral point cannot be protected by this scheme. Often end-users require 100% of stator winging protection against ground faults, which means that the last 5% of the stator winding has to be protected.

EP 1 936 393 A1 relates to an arrangement for measuring an impedance of an electrical device. The arrangement comprises a signal injection unit for injecting a test signal at an off-nominal frequency into an electrical circuit of the electrical device, a signal conversion unit for measuring electrical quantities from the injected test signal, and a processing device for receiving the measured electrical quantities in order to determine the electrical feature. Such an electrical feature can, for example, be used for detecting ground faults for a generator. Redundancy for determining electrical features of the electrical device can be achieved by applying two arrangements, a first and second arrangement. A first signal injection unit of the first arrangement injects a first test signal at a first off-nominal frequency into a first electrical circuit of the device and a second signal injection unit injects a second test signal at a second off-nominal frequency into a second electrical circuit of the device. A first and second processing device calculates the electrical features based on the measured electrical quantities received respectively from a first and second signal conversion unit. An output signal is determined based on a first output signal generated by the first processing unit and a second output signal generated by the second processing.

Two schemes have been described in IEEE Guide for Generator Ground Protection, IEEE Standard C37.101, both of which provide 100% of stator winging protection.

The first scheme is based on a principle that a third harmonic may be produced by a generator in operation and it may appear at the neutral point of a generator as a zero sequence quantity. By measuring the third harmonic at the neutral and the terminals and comparing the measured values, one can determine if a ground fault has occurred and the location of the ground fault, i.e. if the ground fault occurs at the neutral or at the terminals. However, this scheme won't work when the machine is standstill and another disadvantage is that the scheme is dependent on the production of the third harmonic of the machine and a fact is that not every electric generator produces a third harmonic at the neutral.

The operation of the second scheme is based on injection of a signal at a different frequency than the fundamental system frequency at which an electric machine is operated. A signal is injected at one of sub-harmonics. A typical value can be for example 12.5 Hz or 20 Hz with respect to a fundamental frequency 50 Hz or 60 Hz. By measuring the change of the sub-harmonic electrical quantities resulted by the injected signal, a ground fault can be detected. However, this scheme has a dependence of a grounding system of the electric machine, which means that the components and the arrangement of the scheme are varied accordingly, for example, one may inject signal at the neutral or at terminal of the machine. Mostly, both current and voltage have to be measured, which results in a costly solution.

Besides ground faults, an electric machine is also subjected to other types faults, for example overvoltage, unbalanced current, overheating, turn-to-turn fault, phase-to-phase fault etc. To protect the electric machine against various faults, a number of protective systems equipped with a number of measuring devices are provided. For example, an instrument transformer having a primary and a secondary winding is often provided at the neutral of the electric machine for measuring voltages. Based on the measurement a protective relay may initialize a protective scheme accordingly. Another typical arrangement is that a unit transformer/step-up transformer is connected to the electric machine.

SUMMARY OF THE INVENTION

One object of the present invention is to provide a simplified device for detecting a ground fault, which overcomes the above-mentioned disadvantages of the prior arts.

This object is achieved by a ground fault detecting arrangement, characterized in that the signal injection unit is configured to inject a signal to the secondary winding of the voltage transformer, the instrument transformer is configured to measure the resultant injected signal at its secondary winding, and the ground fault detecting unit is configured to detect a ground fault based on the measured signal.

The operation principle of the invention is based on if a ground fault occurs at or close to the neutral point, the measured resultant injected signal will decrease or disappear at the neutral point, while under a normal operation, the injected signal will be present at the neutral point.

By measuring and examining the injected signal at the neutral point, a ground fault occurring at or close to neutral point occurs can be detected. This is particularly important for detection of a stator ground fault since it enables a 100% of stator ground fault protection when used together with already mentioned 95% stator ground fault protection relay.

One advantage of the invention, comparing to the first scheme of the prior art, is that the invention even can detect a ground fault even the machine is standstill because the invention is based on injected signals rather the generation of a third harmonic of the electric machine.

In the case that both or any of the instrument transformer and the voltage transformer already exists in the electric circuit for other protection purposes, they may be respectively configured to inject the signal and to measure the injected signal. In this case, the invention has a further advantage comparing to the second scheme of the prior art because the invention makes it possible that no extra instruments are needed besides those existing measuring instruments. This enables a price value worthy solution especially when the protected machine is a small generator for example. This means that reusing measurements already existing in the network results in a cost efficient solution for customers.

According to one embodiment of the invention, the ground fault detecting unit is further configured to compare the measured signal with a specified threshold and if the measured signal is below the threshold a ground fault close to the neutral point is detected. The ground fault detecting unit may further initialize a signal to a protective unit that may further initialize a trip signal based on severity of the detected ground fault.

According to another embodiment of the invention, the voltage transformer is configured to measure the injected signal at its secondary windings. The ground fault detecting unit is configured to detect a ground fault based on the measured signal from the voltage transformer and the measured signal from the instrument transformer.

According to one embodiment of the invention, the neutral point of the electric machine is either impedance grounded or ungrounded.

According to one embodiment of the invention, the electric machine is any of generator, motor, or reactor and its stator windings are wye-connected.

According to one embodiment of the invention, the instrument transformer connected to the neutral point can be either a voltage transformer or a distribution transformer.

According to one embodiment of the invention, the injected signal is either a voltage or a current signal. The signal is injected with time varying quantity, which means the injected signal has an AC waveform such as sine, square etc.

According to one embodiment of the invention, wherein, in the case that the electrical machine is operated at a fundamental system frequency, the injected signal has a frequency different than the fundamental system frequency.

According to one embodiment of the invention, wherein the injected signal has a voltage magnitude less than 2V in case of the injected signal is a voltage signal.

One object of the present invention is also achieved by a method for detecting a ground fault. Such method comprises steps of injecting a signal to the secondary winding of the unit transformer, measuring the resultant injected signal at the secondary winding of the instrument transformer and determining whether or not a ground fault close to the neutral point has occurred based on the measured resultant injected signal.

The method may further comprise steps of comparing the measured signal with a specified threshold and determining if there is a ground fault based on the comparison result.

Furthermore, the method may also comprise steps of measuring the injected signal at the secondary winding of the voltage transformer and determining a location of a ground fault based on the measured injected signal from the voltage transformer and the measured resultant injected signal from the instrument transformer.

BRIEF DESCRIPTION OF THE DRAWINGS

The invention will now be explained more closely by the description of different embodiments of the invention and with reference to the appended figures.

DETAILED DESCRIPTION OF THE INVENTION

In the following examples, the invention is used to detect a stator ground fault of a generator and a voltage signal is injected to the secondary winding of a voltage transformer. However, the invention is not limited to injecting the voltage signal and an electric machine can be a reactor for example.

Figure 1:
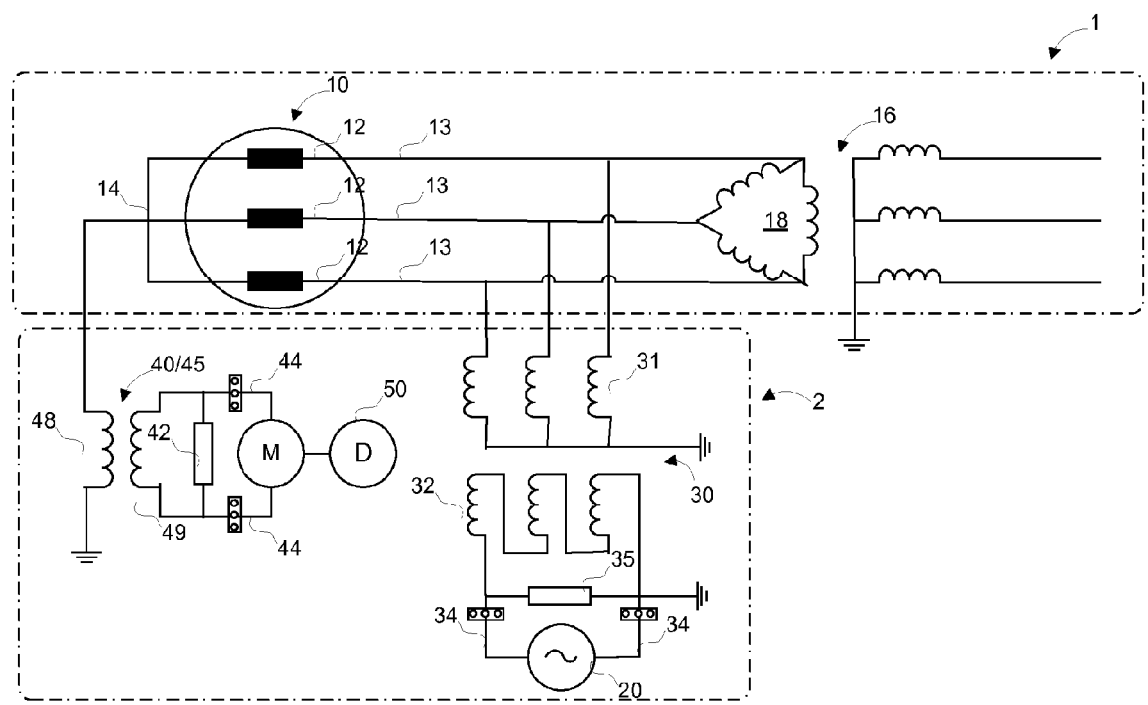
FIG. 1 shows a schematic diagram of an arrangement to detect a ground fault of the stator winding of generator, according to one embodiment of the invention.

FIG. 1 shows an electric circuit 1 comprising a three-phase generator 10 and a unit transformer 16. The generator further comprises stator windings 12 having a neutral point 14 and terminals 13 connected to the primary windings 18 of the unit transformer. In this example, the primary windings of the unit transformer are delta-connected to the terminals of the generator for isolating the generator from external faults of the network. However, it is also possible to have the primary windings of the unit transformer star-connected.

An arrangement 2 is arranged to detect a ground fault of the stator windings and comprises a signal injection unit 20, a voltage transformer 30, an instrument transformer 40 and a fault detecting unit 50. The voltage transformer 30 and instrument transformer 40 have rating of 100-120V on the secondary side.

The voltage transformer 30 is connected to the terminals 13 of the stator windings through its primary winding 31, while its secondary windings 32 is open-delta connected and a resistor 35 is cross-connected to the two ends of the secondary windings 32. The signal injection unit is connected to the secondary windings 32 of the voltage transformer 30 and arranged to generate a signal that is in turn injected to the secondary windings 32 of the transformer 30 through the connection channel 34.

The neutral point 14 of the stator windings is connected to the primary winding 48 of the instrument transformer 40 and impedance grounded via a resistor 42 that is connected across the secondary winding 49 of the instrument transformer to ground the neutral point of the stator windings, which is a most common configuration within ANSI-regulated systems. The resistor is adapted to limit ground fault current to a value that is safe for the generator stator insulation in case of the ground fault occurs in stator. This limit is typically in a range of 3-25 A.

Although in this scheme, the machine is grounded based on an impedance grounding system, the invention however is not limited to this grounding system. It is also applicable in case that no grounding system is present or when a primary grounding system is used. This means that the invention is applicable to an electric machine regardless of its grounding system and a signal is always injected from the terminal side of the electric machine as recommended and measured at the neutral point, which is contrast to the second scheme of the prior art.

More precisely, a voltage transformer 45 is used to transform the voltages in the stator neutral point down to a measurable level. Instead of a voltage transformer, a distribution transformer may be used for the same purpose. In such a case, the distribution transformer can have rating up to 240V on the secondary side.

Furthermore, the response of the injected signal is measured at the secondary windings of the transformer 45 through the connection 44 and is further communicated to the ground fault detecting unit that is configured to compare the measured signal with a specified threshold value and to determine if a ground fault has occurred close to the neutral point of the stator windings. During all normal operating conditions the injected signal in the neutral point will be present. In case of a ground fault the response of injected signal will decrease and eventually disappear at the neutral point 14 and consequently will also decrease and eventually disappear at the secondary windings of the transformer 45.

To detect such ground faults and provide protection for the electric machine against the ground faults, a simple undervoltage protection function can be used, which can be located at the same place as the voltage transformer 45. Faults in the other parts of the stator winding will be detected and protected by a standard 95% stator ground fault protection to provide a 100% protection for the stator windings of a generator from ground faults, for example.

Figure 3:
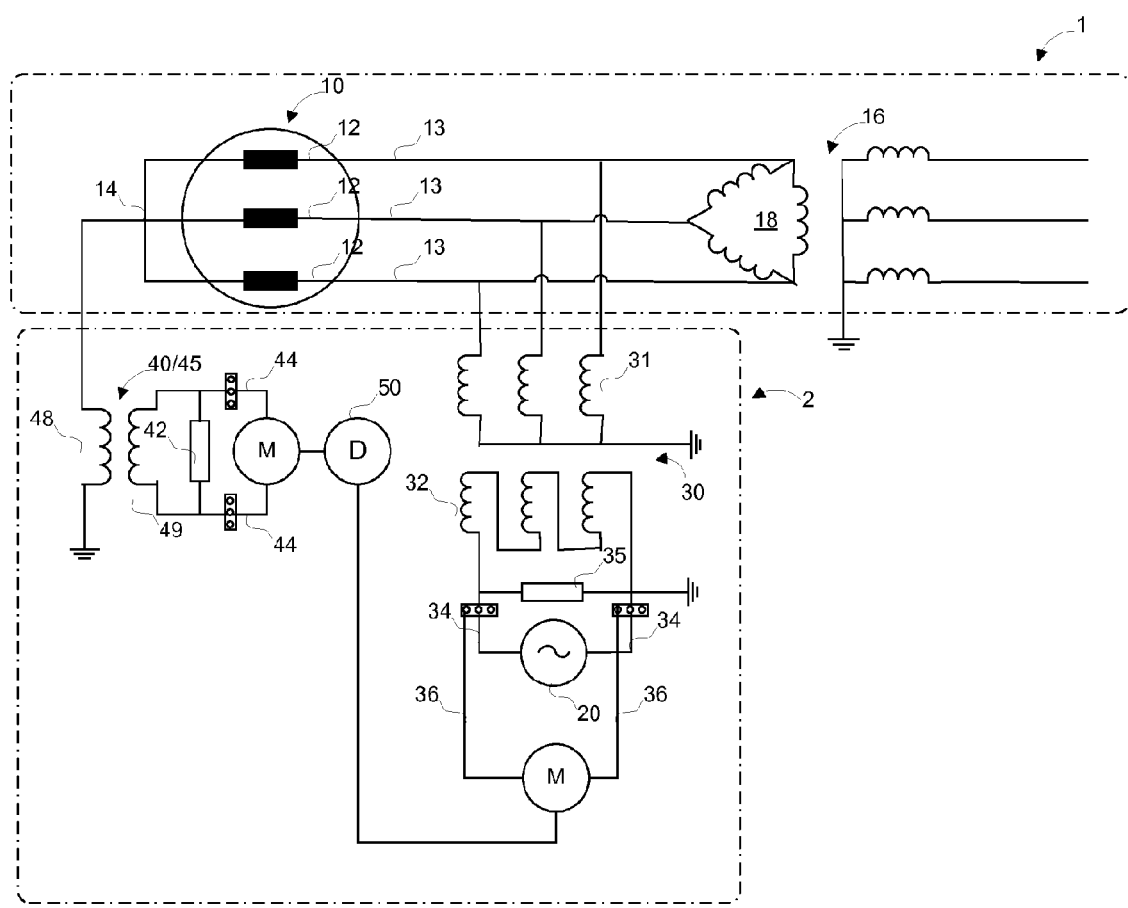
FIG. 3 illustrates a schematic diagram of another arrangement of the invention.

FIG. 3 shows a schematic diagram of another embodiment of the invention, wherein the voltage transformer 30 is further configured to measure the injected signal at its secondary windings via connection 36. The injected signals are measured at the voltage transformer 30 and the voltage transformer 45 respectively and are communicated to the fault detecting unit 50. The fault detecting unit 50 is configured to supervise and compare the measured signals. By comparing the measured signals at the terminals and the neutral point, the detecting unit may determine whether or not there is a ground fault by determining a fault resistance to ground.

Figure 2:
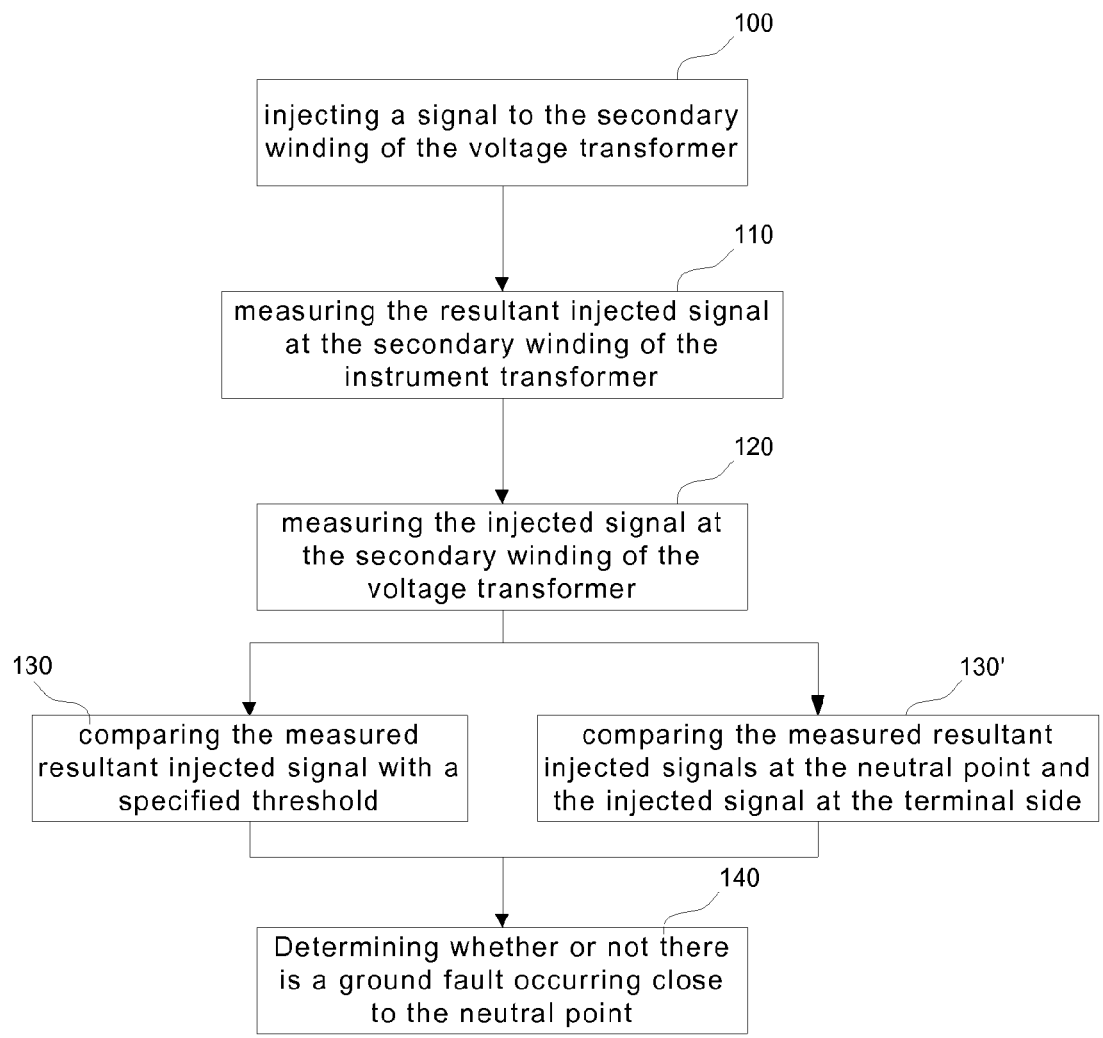
FIG. 2 shows a flow chart of the invented method to detect a ground fault of an electric machine.

FIG. 2 is a flow chart illustration of the invented method for detecting a ground fault of an electric machine unit-connected in an electric circuit.

The method starts by injecting a signal to the secondary winding of the voltage transformer, step 100. The injected signal can in the simplest case be a sinusoidal signal. But they can also have any other suitable shape comprising multiple frequencies with one dominant frequency, as for example a rectangular pulse signal. In the case the electric machine is operated at a fundamental frequency, the signal will be injected at a different frequency. The frequency may be selected to be asynchronous to any other harmonic present in the electric machine, so that the frequency is distinguishable and easily picked out from the spectrum of the signal when the signal is analyzed. For example, the selected frequency may be in a range of 1.6-1.9 times of the fundamental frequency. Preferably, the injected signal shall be a voltage signal and has magnitude less than 2V, preferably in a range of 0.5V to 2.0V.

In the next step 110, the resultant injected signal at the secondary winding of the instrument transformer connected to the neutral point is measured. Furthermore, the injected signal is measured at the secondary winding of the voltage transformer, step 120. The measured resultant injected signal at the secondary winding of the instrument transformer is compared with a specified threshold, step 130 or alternatively, with the measured injected signal at the secondary windings of the voltage transformer that is connected to the terminal side of the electric machine, step 130'.

If the comparison shows that the measured resultant injected signal is below the threshold or alternatively, the measured resultant injected signal decreases while the measured injected signal increases at the terminal side, a ground fault close to the neutral point is detected, step 140. Upon detecting the ground fault, a trip signal may be initialized and the electric machine will be disconnected to the electric circuit by a circuit breaker.

What is claimed is:

1. An arrangement for detecting a ground fault in an AC electric circuit comprising:
    an electric machine having a neutral side connecting to a neutral point and a terminal side, and
    a unit transformer connected to the terminal side of the machine,
wherein the arrangement comprises a signal injection unit, a voltage transformer having a primary winding connected to the terminal side of the electric machine and a secondary winding that is open delta-connected, an instrument transformer having a primary winding connected to the neutral point of the electric machine and a secondary winding, and a ground fault detecting unit characterized in that
    the signal injection unit is configured to inject a signal to the secondary winding of the voltage transformer,
    the instrument transformer is configured to measure the resultant injected signal at its secondary winding, in the form of voltage, and
    the ground fault detecting unit is configured to detect a ground fault based on the measured signal.

2. The arrangement according to claim 1, wherein ground fault detecting unit is further configured to compare the measured resultant injected signal with a specified threshold and when the measured resultant of the injected signal is below the threshold, a ground fault close to the neutral point is detected.

3. The arrangement according to claim 1, wherein the voltage transformer is configured to measure the injected signal at its secondary winding, the ground fault detecting unit is configured to detect a ground fault based on the measured injected signal from the voltage transformer and the measured resultant signal from the instrument transformer.

4. The arrangement according to claim 1, wherein the neutral point of the electric machine is either impedance grounded or ungrounded.

5. The arrangement according to claim 1, wherein the electric machine is any of generator, motor, or reactor and its windings are wye-connected.

6. The arrangement according to claim 1, wherein the instrument transformer is either a voltage transformer or a distribution transformer.

7. The arrangement according to claim 1, wherein the injected signal is either a voltage having an AC waveform or a current signal having an AC waveform.

8. The arrangement according to claim 1, wherein when the electrical machine is operated at a fundamental system frequency, the injected signal has a frequency different than the fundamental system frequency.

9. The arrangement according to claim 1, wherein, in case of the injected signal is a voltage signal, the injected signal has a voltage magnitude less than 2V.

10. A method for detecting a ground fault in an electrical circuit comprising:
    an electric machine having a neutral side connecting to a neutral point and a terminal side,
    a unit transformer connected to the terminal side of the machine,
    a voltage transformer having a primary winding connected to the terminal side of the machine and a secondary winding that is open delta-connected and,
    an instrument transformer having a primary winding connected to the neutral point and a secondary winding,
characterized in that the method comprises steps of,
    injecting a signal to the secondary winding of the voltage transformer, measuring the resultant injected signal at the secondary winding of the instrument transformer, in the form of voltage and, determining whether or not a ground fault has occurred at the neutral point based on the measured resultant injected signal.

11. The method according to claim 10, wherein the method further comprises steps of comparing the measured signal with a specified threshold and determining when there is a ground fault based on the comparison result.

12. The method according to claim 10, wherein the method further comprises steps of measuring the injected signal at the secondary winding of the voltage transformer and determining the location of a ground fault based on the measured injected signal from the voltage transformer and the measured resultant injected signal from the instrument transformer.

* * * * *